(12) United States Patent
Naylor-Warren

(10) Patent No.: US 10,371,311 B2
(45) Date of Patent: Aug. 6, 2019

(54) STAND FOR MOBILE ELECTRONIC DEVICE

(71) Applicant: Nikola Taisha Naylor-Warren, Arnold, PA (US)

(72) Inventor: Nikola Taisha Naylor-Warren, Arnold, PA (US)

(*) Notice: Subject to any disclaimer, the term of this patent is extended or adjusted under 35 U.S.C. 154(b) by 0 days.

(21) Appl. No.: 15/591,395

(22) Filed: May 10, 2017

(65) Prior Publication Data

US 2018/0263125 A1    Sep. 13, 2018

Related U.S. Application Data

(60) Provisional application No. 62/469,050, filed on Mar. 9, 2017.

(51) Int. Cl.
| | | |
|---|---|---|
| *F16M 11/04* | (2006.01) | |
| *F16M 11/38* | (2006.01) | |
| *H05K 5/02* | (2006.01) | |
| *H05K 5/00* | (2006.01) | |

(52) U.S. Cl.
CPC .......... *F16M 11/041* (2013.01); *F16M 11/38* (2013.01); *H05K 5/0086* (2013.01); *H05K 5/0204* (2013.01)

(58) Field of Classification Search
CPC ...... H05K 5/0204; H05K 5/0086; A47G 1/02; F16M 11/041; F16M 11/38
USPC ........................................................ 248/447
See application file for complete search history.

(56) References Cited

U.S. PATENT DOCUMENTS

| | | | |
|---|---|---|---|
| 2,097,651 A | 11/1937 | Stangeland | |
| 4,501,045 A | 2/1985 | Boyer | |
| 5,996,956 A * | 12/1999 | Shawver | G06F 1/1626 248/309.1 |
| 8,376,303 B2 | 2/2013 | Yang et al. | |
| 8,454,254 B2 * | 6/2013 | Hargreaves | H01H 13/86 248/454 |
| 8,746,638 B2 | 6/2014 | Carney | |
| 8,960,634 B2 * | 2/2015 | Le Gette | F16M 11/04 248/163.1 |
| 9,022,341 B2 * | 5/2015 | Radmard | F16M 11/00 211/189 |
| 9,211,001 B2 * | 12/2015 | Negretti | A47B 23/04 |
| 9,288,920 B1 * | 3/2016 | Steiner | F16M 11/38 |
| 9,303,810 B2 * | 4/2016 | Adams | F16M 11/38 |
| 9,657,892 B1 * | 5/2017 | Gong | F16M 13/02 |
| 9,715,248 B2 * | 7/2017 | Wu | G06F 1/16 |
| 2013/0026112 A1 * | 1/2013 | Ting | H04R 1/026 211/26 |
| 2015/0176756 A1 * | 6/2015 | Adams | F16M 11/38 248/157 |
| 2015/0197177 A1 * | 7/2015 | Eyler | B60P 7/0807 248/346.03 |
| 2015/0245519 A1 * | 8/2015 | Forristall | H02J 7/0054 320/103 |
| 2015/0301339 A1 * | 10/2015 | Harris | G06F 1/1601 345/648 |

(Continued)

*Primary Examiner* — Nkeisha Smith
(74) *Attorney, Agent, or Firm* — Ballard Spahr LLP

(57) ABSTRACT

A stand to support mobile devices has a base to which panels are attached. The panels are angularly oriented with respect to the base and each has a slot adapted to receive the mobile device. The panels may be integrally formed with the base or may be attached by hinges having detents or springs to support the panels in a desired orientation.

8 Claims, 6 Drawing Sheets

(56) References Cited

U.S. PATENT DOCUMENTS

2016/0044805 A1* 2/2016 Fan .................. B60R 11/02
232/4 R

* cited by examiner

STAND FOR MOBILE ELECTRONIC DEVICE

CROSS REFERENCE TO RELATED APPLICATION

This application is based upon and claims benefit of priority to U.S. Provisional Application No. 62/469,050, filed Mar. 9, 2017 and hereby incorporated by reference.

FIELD OF THE INVENTION

This invention relates to stands for supporting electronic devices such as mobile phones and tablets.

BACKGROUND

It is advantageous to use multiple devices, such as a computer, a mobile phone and/or a tablet simultaneously. While a computer screen and keyboard are ergonomically designed for use at a desk, the same cannot be said for mobile devices, which are designed primarily to be hand held. Mobile devices therefore do not have support features which allow them to be conveniently viewed and used in conjunction with other mobile devices or desk top or laptop computers. There is clearly a need for a support for mobile devices which allows them to be readily viewed and used when not being held in the hand.

SUMMARY

The invention concerns a stand for supporting an electronic device. One example embodiment of a stand according to the invention comprises a base having first and second sides oppositely disposed from one another. A first panel has a first side attached to the first side of the base and a second side oppositely disposed. The first panel is oriented angularly with respect to the base. A first slot is positioned in the first panel. The first slot extends from the second side toward the first side of the first panel. The first slot is adapted to receive and support the electronic device.

By way of example, the stand may further comprise a second panel having a first side attached to the second side of the base and a second side oppositely disposed. The second panel is oriented angularly with respect to the base. A second slot is positioned in the second panel. The second slot extends from the second side of the second panel toward the first side of the second panel. The second slot is adapted to receive and support the electronic device. The first and second panels may be angularly oriented toward one another in an example embodiment. In another example, the first and second panels may be angularly oriented away from one another. By way of example, the first and second panels may be integrally formed with the base. Further by way of example, at least a portion of the base or at least a portion of the first or second panels are covered by a substrate. A further example embodiment comprises a mirror mounted on the base.

Another example stand for supporting an electronic device according to the invention comprises a base having first and second sides oppositely disposed from one another. A first panel has a first side attached to the first side of the base and a second side oppositely disposed. At least a first hinge attaches the first panel to the base in this example embodiment. A first slot is positioned in the first panel. The first slot extends from the second side toward the first side of the first panel. The first slot is adapted to receive and support the electronic device. An example embodiment may further comprise a second panel having a first side attached to the second side of the base and a second side oppositely disposed. At least a second hinge attaches the second panel to the base in this example. A second slot is positioned in the second panel. The second slot extends from the second side of the second panel toward the first side of the second panel. The second slot is adapted to receive and support the electronic device.

By way of example, the stand may further comprise a first spring acting between the base and the first panel and a second spring acting between the base and the second panel. The first and second springs respectively bias the first and second panels away from the base in an example embodiment. A further example embodiment comprises at least a first detent acting between the base and the first panel. At least a second detent acts between the base and the second panel. The first and second detents may comprise respective detent hinges in an example embodiment. In another example, the first and second detents may comprise respective ratchet hinges.

In an example embodiment, the first and second sides of the base are oriented parallel to one another and the first and second slots are aligned with one another along a line oriented perpendicular to the first and second sides of the base. By way of example, the base may comprise a plate having a rectangular shape defined by two oppositely disposed long sides and two oppositely disposed short sides. In a specific example, the first and second sides comprise the long sides. In a further example, the first and second panels comprise respective plates, each having a rectangular shape. In a particular example, at least a portion of the base or at least a portion of the first or second panels are covered by a substrate. In an example embodiment a mirror may be mounted on the base.

DETAILED DESCRIPTION

Figure 1:
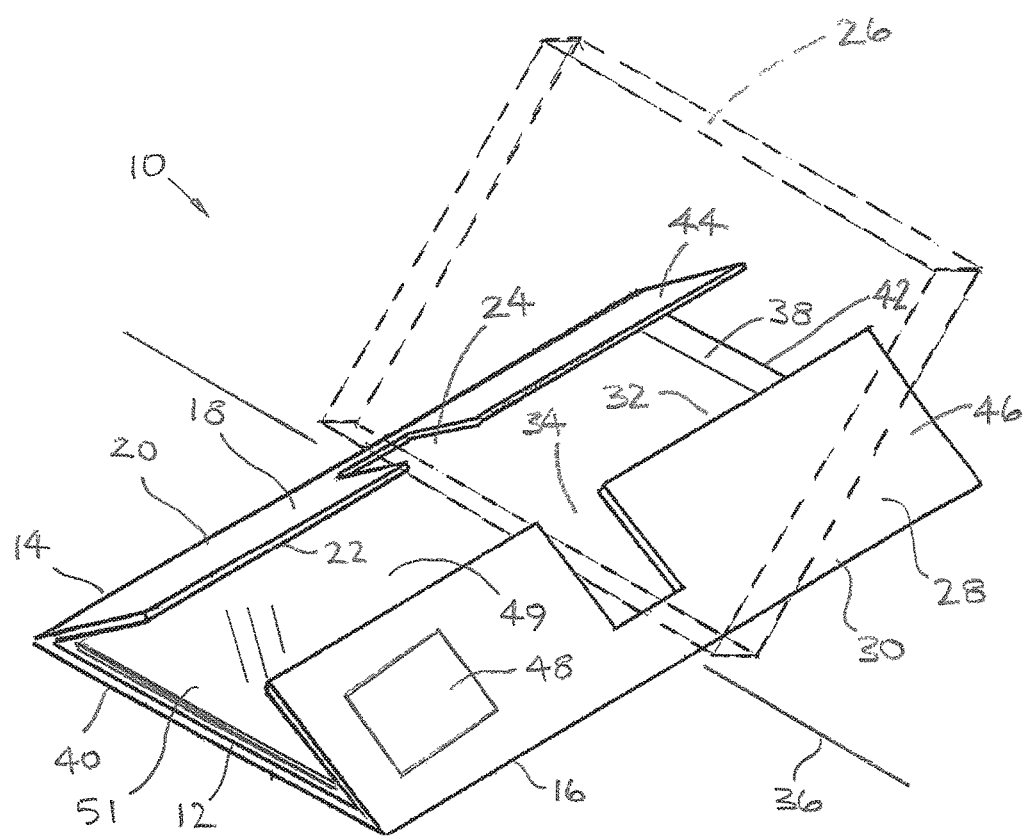
FIG. 1 is an isometric view of an example embodiment of a stand according to the invention.

FIG. 1 shows an example embodiment of a stand 10 according to the invention. Stand 10 comprises a base 12 having first and second sides 14 and 16 oppositely disposed from one another. A first panel 18 has a first side 20 which is attached to the first side 14 of base 12. Panel 18 is oriented angularly with respect to the base 12. For a practical design, angles from 30° to 150°, and including 90°, are feasible. Panel 18 also has a second side 22 oppositely disposed from the first side 20. A first slot 24 is positioned in the first panel 18. The first slot 24 extends from the second side 22 of the first panel 18 toward the first side 20. As shown in FIG. 1, the slot 24 is adapted to receive and support an electronic device 26, such as a mobile phone or a tablet.

Stand 10 may also comprise a second panel 28. Second panel 28 has a first side 30 attached to the second side 16 of the base 12. Second panel 28 is also oriented angularly with respect to base 12 and has a second side 32 oppositely disposed from the first side 30. A second slot 34 is positioned in the second panel 28. The second slot 34 extends from the second side 32 of the second panel 28 toward the first side 30. As further shown in FIG. 1, the second slot 34 is also adapted to receive and support the electronic device 26.

Figure 1A:
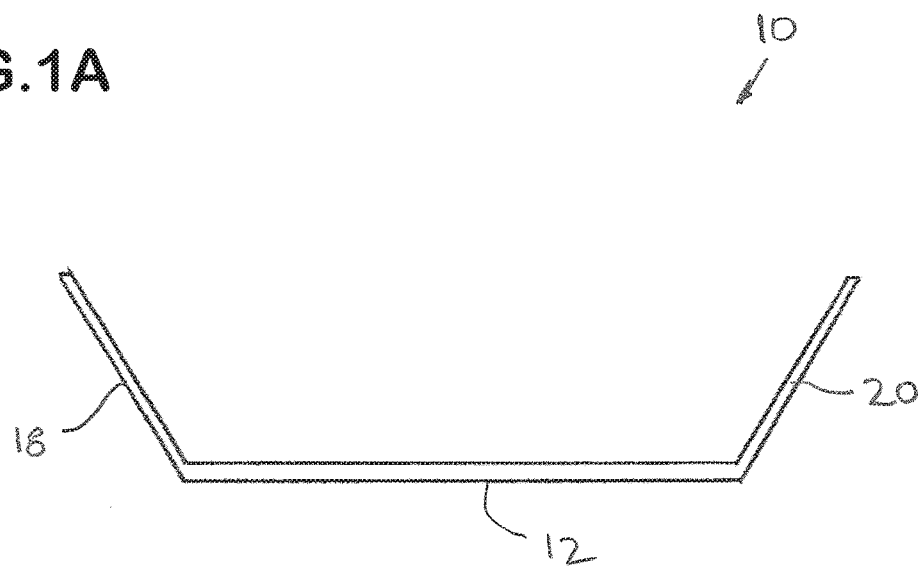
FIG. 1A is an end view of the example stand shown in FIG. 1.

In the example embodiment shown in FIG. 1 the first and second sides 14 and 16 of base 12 are oriented parallel to one another. The first and second slots 24 and 34 are aligned with one another along a line 36 oriented perpendicular to the sides 14 and 16. Further by way of example, base 12 comprises a plate 38 having a rectangular shape defined by two oppositely disposed long sides (the first and second sides 14 and 16) and two oppositely disposed short sides 40 and 42. The first and second panels 18 and 28 also comprise respective plates 44 and 46, and each also has a rectangular shape in this example. Panels 18 and 28 are angularly oriented toward one another in this example and are integrally formed with the base 12. In another example shown in FIG. 1A, panels 18 and 28 are angularly oriented away from one another. In a practical example, stand 10 may be formed from a unitary metal plate, for example, aluminum or stainless steel, in which the slots are cut and portions of the plate bent to form the panels. The stand 10 could also be extruded, and made from a plastic resin. All or portions of the base 12 and the panels 18 and 28 may be covered by a substrate 48 such as a decorative decal, ornamental pattern, or a protective plastic resin coating to cite a few examples. The space 49 on the base 12 between the panels 18 and 28 forms a storage area which can be used to hold a writing instrument or other item. A mirror 51 may also be mounted on base 12.

Figure 2:
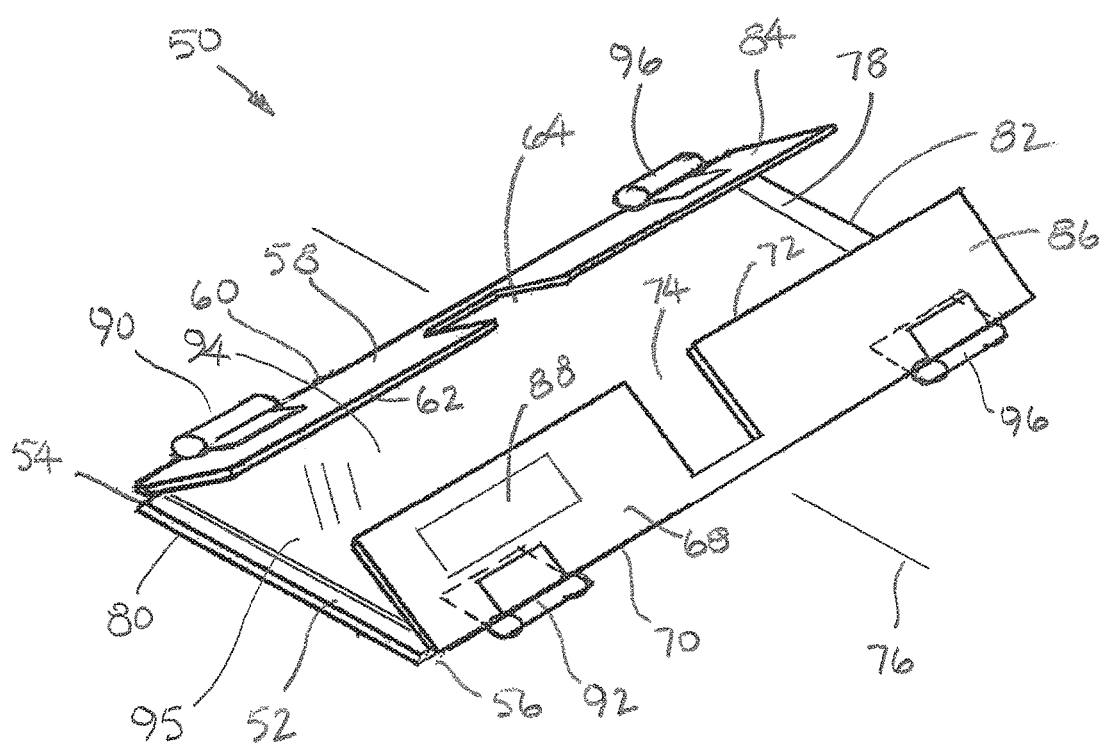
FIG. 2 is an isometric view of another example embodiment of a stand according to the invention.

FIG. 2 illustrates another stand embodiment 50 according to the invention. Stand 50 comprises a base 52 having first and second sides 54 and 56 oppositely disposed from one another. A first panel 58 has a first side 60 which is attached to the first side 54 of base 52. In this example, panel 58 is attached to the base 52 via one or more hinges 90. Panel 58 also has a second side 62 oppositely disposed from the first side 60. A first slot 64 is positioned in the first panel 58. The first slot 64 extends from the second side 62 of the first panel 58 toward the first side 60. Like the slot 24, the slot 64 is adapted to receive and support an electronic device, such as a mobile phone or a tablet (see FIG. 1).

Stand 50 may also comprise a second panel 68. Second panel 68 has a first side 70 attached to the second side 56 of the base 52. Second panel 68 is also attached to base 52 via one or more hinges 92 and has a second side 72 oppositely disposed from the first side 70. A second slot 74 is positioned in the second panel 68. The second slot 74 extends from the second side 72 of the second panel 68 toward the first side 70. The second slot 74 is also adapted to receive and support an electronic device.

In the example embodiment shown in FIG. 2 the first and second sides 54 and 56 of base 52 are oriented parallel to one another. The first and second slots 64 and 74 are aligned with one another along a line 76 oriented perpendicular to the sides 54 and 56. Further by way of example, base 52 comprises a plate 78 having a rectangular shape defined by two oppositely disposed long sides (the first and second sides 54 and 56) and two oppositely disposed short sides 80 and 82. The first and second panels 58 and 68 also comprise respective plates 84 and 86, and each also has a rectangular shape in this example. All or portions of the base 52 and the panels 58 and 68 may be covered by a substrate 88 such as a decorative decal, ornamental pattern, or a protective plastic resin coating to cite a few examples. The space 94 on the base 52 between the panels 58 and 68 forms a storage area which can be used to hold a writing instrument or other item. A mirror 95 may also be mounted on the base 52.

Figure 2A:
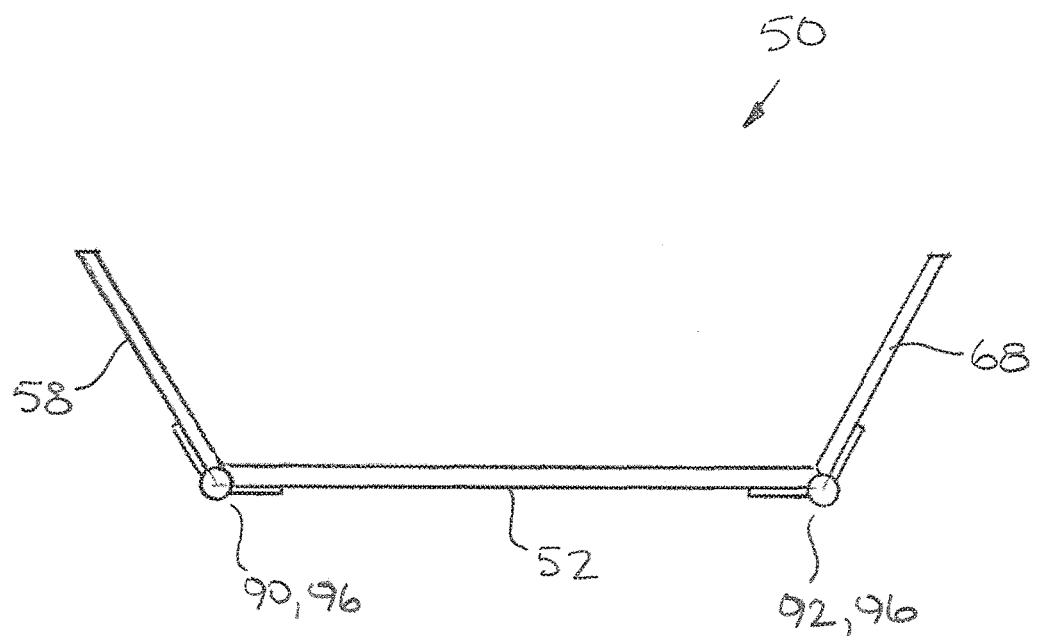
FIG. 2A is an end view of the example stand shown in FIG. 2.

The use of hinges 90 and 92 to attach panels 58 and 68 to the base 52 allows the angle between the panels and the base to be varied to best suit the particular device being supported by the stand 50. For a practical design, angles from 30° to 150°, and including 90°, are feasible. FIGS. 2 and 2A illustrate both acute (FIG. 2) and obtuse (FIG. 2A) orientations of the panels 58 and 68. Acute orientation angles have the panels angled toward one another; obtuse orientation angles have the panels angled away from one another. To this end, it is advantageous that one or more of the hinges comprise a detent 96 acting between base 52 and the panels 58 and 68. Example detent hinges are found in U.S. Pat. No. 2,097,651 which discloses a ratchet-type detent, and U.S. Pat. No. 4,501,045, which discloses a spring biased plunger type detent. U.S. Pat. Nos. 2,097,651 and 4,501,045 are hereby incorporated by reference. The detent 96, in the form of hinges 92 and 94, permit the angle between the panels 58 and 68 and the base 52 to be set as desired, and still allow the panels to be folded flat against the base for convenient storage of the stand 50. Hinges which use friction to hold the angular position between panels are also feasible.

Figure 3:
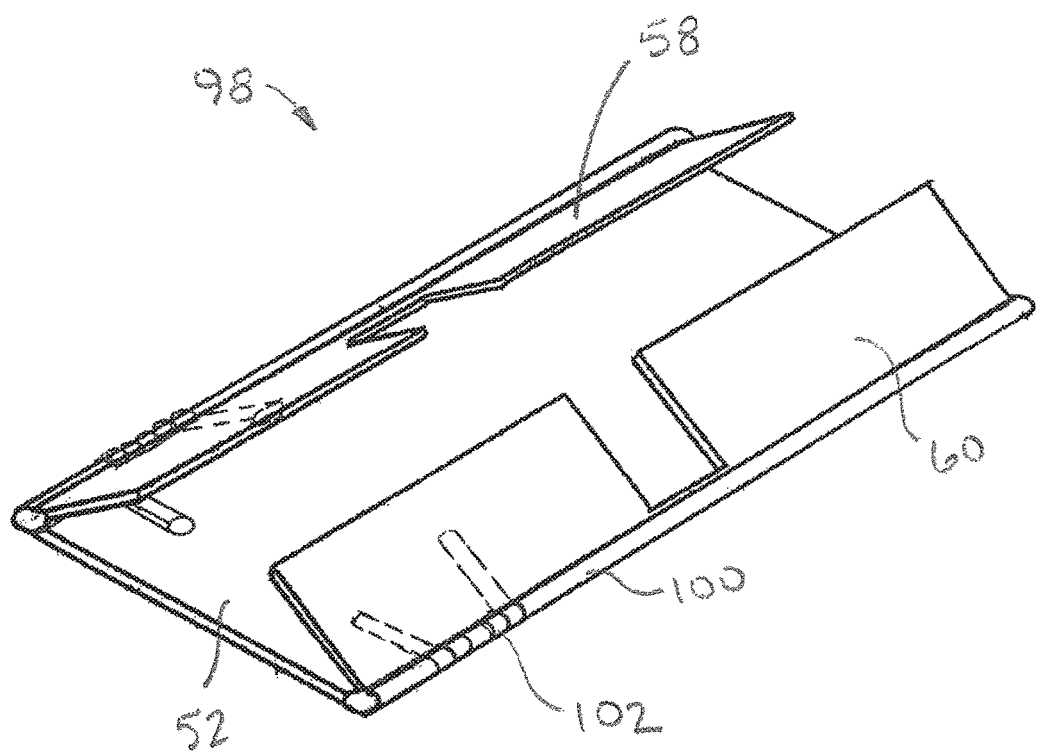
FIG. 3 is an isometric view of another example embodiment of a stand according to the invention.

FIG. 3 shows another example embodiment of a stand 98 which uses single hinges 100, such as piano hinges, to attach panels 58 and 68 to base 52. Springs 102 acting between the base and each of the panels may be used to support the panels at a desired angle with respect to the base 52.

Figure 4:
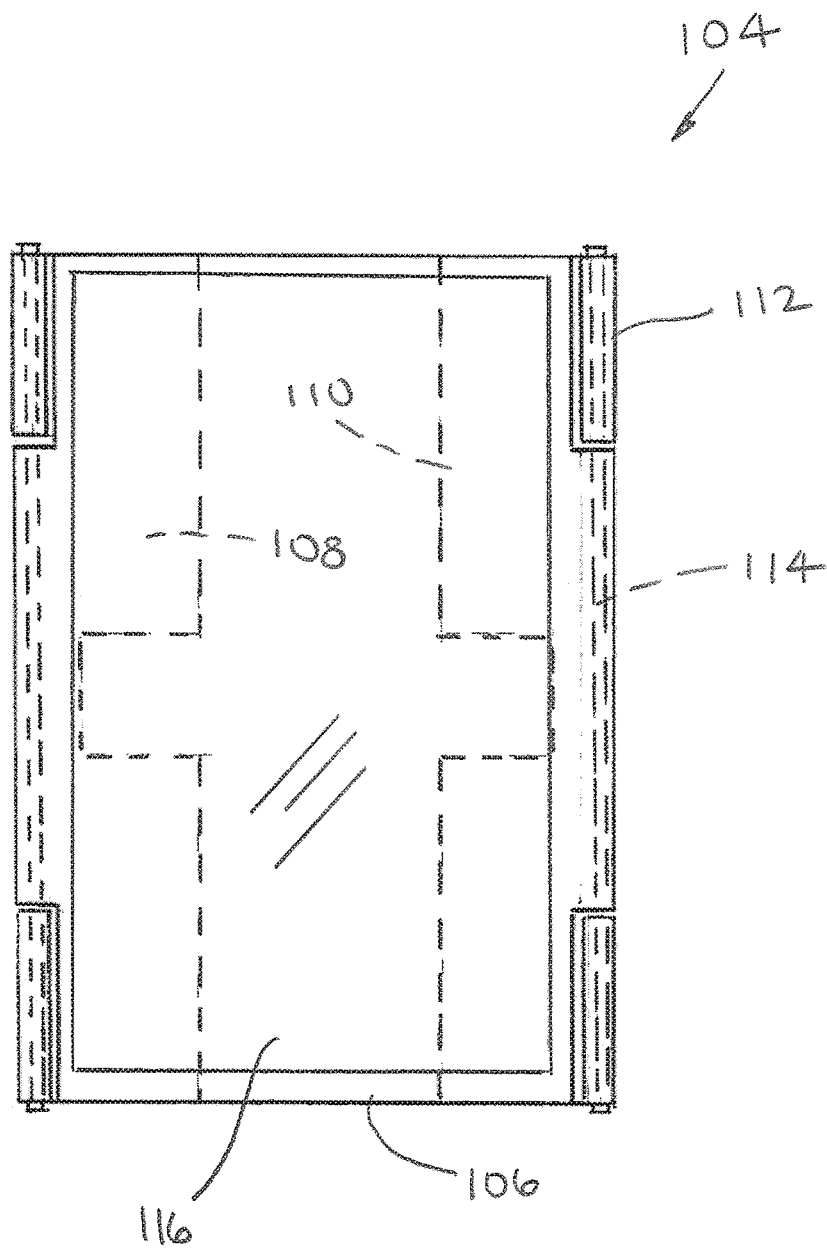
FIG. 4 is a bottom view of another example embodiment of a stand according to the invention.

FIG. 4 shows a bottom view of another example embodiment of a stand 104. Stand 104 comprises a base 106 to which side panels 108 and 110 are attached by hinges 112. Hinges 112 on each side of the base 106 conform to the outline of the stand and pivot on a single shaft 114. The hinges may be detent hinges, for example ratchet type, or ball type, or plunger detents as noted above, as well as frictional hinges to permit side panels 108, 110 to rotate to a desired angular position relative to the base 106, and then remain in that position until moved again. Stand embodiment 104 may also have a mirror 116 mounted on the base 106, in this example the mirror being on the bottom surface of the base, opposite to panels 108 and 110.

Stands as disclosed herein are expected to provide greater convenience for the use of mobile devices such as mobile phones and tablets.

What is claimed is:

1. A stand for supporting an electronic device, said stand consisting of:
    a base having first and second sides oppositely disposed from one another;
    a first panel having a first side integrally formed with said first side of said base and a second side oppositely disposed, said first panel being oriented at a first fixed angle with respect to said base;
    a first slot positioned in said first panel, said first slot extending from said second side of said first panel toward said first side of said first panel, said first slot being adapted to receive and support said electronic device;
    a second panel having a first side integrally formed with said second side of said base and a second side oppositely disposed, said second panel being oriented at a second fixed angle with respect to said base;

a second slot positioned in said second panel, said second slot extending from said second side of said second panel toward said first side of said second panel, said second slot being adapted to receive and support said electronic device;

wherein said first and second panels being oriented at first and second fixed angles with respect to said base are non-movable once said stand is fabricated, said first and second fixed angles ranging from 30 to 150 degrees.

2. The stand according to claim 1, wherein said first and second sides of said base are oriented parallel to one another and said first and second slots are aligned with one another along a line oriented perpendicular to said first and second sides of said base.

3. The stand according to claim 1, wherein said base consists of a plate having a rectangular shape defined by two oppositely disposed long sides and two oppositely disposed short sides.

4. The stand according to claim 3, wherein said first and second sides consist of said long sides.

5. The stand according to claim 4, wherein said first and second panels consist of respective plates, each having a rectangular shape.

6. The stand according to claim 1, wherein at least a portion of said base or at least a portion of said first or second panels are covered by a substrate.

7. The stand according to claim 1, further consisting of a mirror mounted on said base.

8. The stand according to claim 1, further consisting of a storage space on said base positioned between said first and second panels.

* * * * *